United States Patent
Xu et al.

(10) Patent No.: US 9,281,325 B2
(45) Date of Patent: Mar. 8, 2016

(54) ARRAY SUBSTRATE, MANUFACTURING METHOD THEREOF AND DISPLAY DEVICE

(71) Applicant: BOE TECHNOLOGY GROUP CO., LTD., Beijing (CN)

(72) Inventors: Chao Xu, Beijing (CN); Chunfang Zhang, Beijing (CN); Yan Wei, Beijing (CN); Heecheol Kim, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/126,905

(22) PCT Filed: Dec. 7, 2012

(86) PCT No.: PCT/CN2012/086218
§ 371 (c)(1),
(2) Date: Dec. 17, 2013

(87) PCT Pub. No.: WO2013/181908
PCT Pub. Date: Dec. 12, 2013

(65) Prior Publication Data
US 2014/0175448 A1    Jun. 26, 2014

(30) Foreign Application Priority Data
Jun. 8, 2012 (CN) .......................... 2012 1 0189788

(51) Int. Cl.
*H01L 27/12* (2006.01)
*G02F 1/1368* (2006.01)
*G02F 1/1343* (2006.01)

(52) U.S. Cl.
CPC .......... *H01L 27/1262* (2013.01); *G02F 1/1368* (2013.01); *G02F 1/13439* (2013.01); *H01L 27/124* (2013.01); *H01L 27/1248* (2013.01); *H01L 27/1259* (2013.01); *G02F 2001/134372* (2013.01)

(58) Field of Classification Search
CPC ..................... G02F 1/133707; G02F 1/134363; G02F 1/1368; G02F 2001/134372; H01L 27/02; H01L 29/786; H01L 27/1248; H01L 27/124; H01L 27/1259; H01L 27/1262
See application file for complete search history.

(56) References Cited

U.S. PATENT DOCUMENTS 6,665,035 B2 * 12/2003 Lee ............................... 349/129
6,747,723 B2 * 6/2004 Hanakawa et al. ........... 349/147

(Continued)

FOREIGN PATENT DOCUMENTS

| CN | 1293625 C | 1/2007 |
|---|---|---|
| CN | 102087450 A | 6/2011 |
| CN | 102723308 A | 10/2012 |

OTHER PUBLICATIONS

Written Opinion of the International Searching Authority mailing date Mar. 21, 2013; PCT/CN2012/086218.

(Continued)

*Primary Examiner* — Latanya N Crawford
(74) *Attorney, Agent, or Firm* — Ladas & Parry LLP

(57) ABSTRACT

An array substrate, a manufacturing method thereof and a display device are provided. As for the method of manufacturing the array substrate, the common electrode and the pixel electrode are formed by a single process simultaneously. Therefore, the problems of process complexity and the higher costs in the existing manufacturing process of array substrate can be solved.

17 Claims, 4 Drawing Sheets

(56) References Cited

U.S. PATENT DOCUMENTS

| | | | |
|---|---|---|---|
| 7,593,084 B2* | 9/2009 | Nam et al. | 349/141 |
| 8,456,599 B2* | 6/2013 | Jeong et al. | 349/141 |
| 8,860,028 B2* | 10/2014 | Kwack | 257/59 |
| 2010/0091228 A1* | 4/2010 | Kim et al. | 349/122 |
| 2011/0013129 A1* | 1/2011 | Jeong et al. | 349/141 |
| 2011/0317104 A1* | 12/2011 | Nakamura et al. | 349/106 |
| 2012/0184060 A1* | 7/2012 | Song et al. | 438/34 |
| 2012/0286651 A1* | 11/2012 | Levermore et al. | 313/504 |
| 2013/0114017 A1* | 5/2013 | Qin et al. | 349/43 |

OTHER PUBLICATIONS

International Search Report Issued Mar. 6, 2013 Appln. No. PCT/CN2012/086218.
International Preliminary Report on Patentability Appln. No. PCT/CN2012/086218; Dated Dec. 9, 2014.

* cited by examiner

ARRAY SUBSTRATE, MANUFACTURING METHOD THEREOF AND DISPLAY DEVICE

FIELD OF THE INVENTION

Embodiments of the invention relate to an array substrate, a manufacturing method thereof and a display device.

BACKGROUND

With the industry's progress and TFT technology improvements, advanced super dimension switching (AD-ADS, abbreviated as ADS) wide viewing angle technology has been applied to an increasing number of products, and its excellent display characteristics have been praised highly by users, and it has a highly competitive market.

ADS technology forms a multiple dimensional electric field with an electric field generated at edges of slit electrodes in the same plane and an electric field generated between the slit electrodes and a plate electrode, so as to enable rotation of liquid crystal molecules with all orientations between slit electrodes and over the electrodes, thereby improving the efficiency of the liquid crystal and increasing the light transmission efficiency. Advanced super dimension switching technology can improve picture quality of the TFT-LCD product with advantages such as high resolution, high transmittance, low power consumption, wide viewing angle, high aperture ratio, low color, and being free of push Mura.

Due to ADS's own characteristics, its array process is more complex compared with the traditional TN product, and both patterning processes and Tact Time are increased, thereby resulting in higher cost. For example, FIG. 1 is a structural diagram for an array substrate of a conventional ADS product, and manufacturing the array substrate requires six patterning processes, i.e., gate patterning, active patterning, S/D patterning, $1^{st}$ ITO patterning (forming a plate electrode), PVX patterning and $2^{nd}$ ITO patterning (forming slit electrodes). The patterning process is complex with higher production costs.

SUMMARY

Embodiments of the invention provide an array substrate, a manufacturing method thereof and a display device, which, for example, can solve the problems such as process complexity and high production costs in the existing manufacturing process of array substrate.

An embodiment of the invention provides a method of manufacturing an array substrate, wherein, a common electrode and a pixel electrode are formed at the same time through a single process.

In one example, the manufacturing method comprising:

sequentially forming a gate metal layer and a gate insulating layer on a base substrate, the gate metal layer comprising patterns of a gate electrode and a gate line;

forming a pattern of an active layer on the substrate formed with the gate insulating layer;

forming patterns of a data line, a source electrode and a drain electrode on the substrate formed with the active layer, and forming a pattern of a conductive layer having at least one slit in a pixel region;

forming a pattern of a passivation layer on the substrate formed with the data line, the source electrode, the drain electrode and the conductive layer, the passivation layer having a passivation layer slit in a one-to-one correspondence with the slit in the conductive layer;

forming a transparent conductive layer on the substrate formed with the passivation layer, the transparent conductive layer comprising two layers, one of which is formed over the passivation layer to form a common electrode, and the other of which is located in the slit region, in the same layer as and electrically connected to the conductive layer to form a pixel electrode.

In one example, forming patterns of a data line, a source electrode and a drain electrode on the substrate formed with the active layer, and forming a pattern of a conductive layer having at least one slit in a pixel region comprises:

forming a source-drain metal layer on the substrate formed with the pattern of the active layer;

by a patterning process, forming the data line, the source electrode and the drain electrode with a space therebetween above the active layer, and forming the conductive layer pattern having at least one slit in the pixel region defined by the data line and the gate line crossing with each other.

In one example, forming a pattern of a passivation layer on the substrate formed with the data line, the source electrode, the drain electrode and the conductive layer, the passivation layer having a passivation layer slit in a one-to-one correspondence with the slit in the conductive layer comprises:

forming a passivation layer film on the substrate formed with the data line, the source electrode, the drain electrode and the conductive layer;

applying a layer of photoresist on the passivation layer, and forming the passivation layer slit in the pixel region which is in a one-to-one correspondence with the slit in the conductive layer by one patterning process.

In one example, forming a transparent conductive layer on the substrate formed with the passivation layer, the transparent conductive layer comprising two layers, one of which is formed over the passivation layer to form a common electrode, and the other of which is located in the slit region, in the same layer as and electrically connected to the conductive layer to form a pixel electrode comprises:

forming the transparent conductive layer on the substrate formed with the passivation layer, so that a portion of the transparent conductive layer remains over the passivation layer to form a first transparent electrode layer, and the first transparent electrode layer is the common electrode, and another portion of the transparent conductive layer is filled into the slit of the conductive layer, and is electrically connected with the conductive layer to form a second transparent electrode layer, the second transparent electrode layer is connected to the drain electrode to form the pixel electrode.

In one example, the manufacturing method comprising:

forming patterns of a gate electrode and a gate line on a base substrate, and forming a pattern of a conductive layer having at least one slit in a pixel region;

forming a gate insulating layer on the substrate formed with the gate electrode, the gate line and the conductive layer, and forming a gate insulating layer slit in the pixel region by a patterning process, the gate insulating layer slit and the slit in the conductive layer being in a one-to-one correspondence;

forming a pattern of an active layer on the substrate formed with the gate insulating layer;

forming patterns of a source electrode, a drain electrode and a data line on the substrate formed with the active layer;

forming a passivation layer on the substrate formed with the source electrode, the drain electrode and the data line, and forming a passivation layer slit in the pixel region by a patterning process, the passivation layer slit and the gate insulating layer slit being in one-to-one correspondence;

forming a transparent conductive layer on the substrate formed with the passivation layer, the transparent conductive layer comprising two layers, one of which is formed over the passivation layer to form a common electrode, and the other of which is located in the slit region, in the same layer as and electrically connected to the conductive layer to form a pixel electrode.

In one example, forming patterns of a gate electrode and a gate line on a base substrate, and forming a pattern of a conductive layer having at least one slit in a pixel region comprises:

forming a gate metal layer on the base substrate;

through one patterning process, forming the gate electrode and the gate line, and forming the pattern of the conductive layer which is formed of the gate metal layer in the pixel region, the conductive layer having at least one slit.

In one example, forming a gate insulating layer on the substrate formed with the gate electrode, the gate line and the conductive layer, and forming a gate insulating layer slit in the pixel region by a patterning process, the gate insulating layer slit and the slit in the conductive layer being in a one-to-one correspondence comprises:

forming a gate insulating layer film on the substrate formed with the gate electrode, the gate line and the conductive layer;

applying a layer of photoresist on the gate insulating layer, through a patterning process, forming the gate insulating layer with the slit in the pixel region, and the gate insulating layer slit and the conductive layer slit being in a one-to-one correspondence.

In one example, forming a passivation layer on the substrate formed with the source electrode, the drain electrode and the data line, and forming a passivation layer slit in the pixel region by a patterning process, the passivation layer slit and the gate insulating layer slit being in a one-to-one correspondence comprises:

forming a passivation layer film on the substrate formed with the source electrode, the drain electrode and the data line;

applying a layer of photoresist on the passivation layer film, through a patterning process, forming the passivation layer with the slit in the pixel region, and the passivation layer slit and the gate insulating layer slit being in a one-to-one correspondence.

In one example, forming a transparent conductive layer on the substrate formed with the passivation layer, the transparent conductive layer comprising two layers, one of which is formed over the passivation layer to form a common electrode, and the other of which is located in the slit region, in the same layer as and electrically connected to the conductive layer to form a pixel electrode comprises:

forming the transparent conductive layer on the substrate formed with the passivation layer, so that a portion of the transparent conductive layer remains over the passivation layer to form a first transparent electrode layer, the first transparent electrode layer is a common electrode, and another portion of the transparent conductive layer is filled into the slit of the conductive layer and is electrically connected with the conductive layer to form a second transparent electrode layer, the second transparent electrode layer being connected to the drain electrode to form the pixel electrode.

In one example, the conductive layer is made of a transparent conductive material.

An embodiment of the invention further provides an array substrate comprising a common electrode and a pixel electrode fabricated by a single process, wherein the pixel electrode comprises a conductive layer having at least one slit, a transparent conductive layer in the slit and the conductive layer are connected to each other to form the pixel electrode;

the conductive layer is in the same layer as a gate line or a data line on the array substrate.

In one example, the array substrate comprises:

a base substrate;

a gate electrode and a gate line formed on the base substrate;

a gate insulating layer formed on the base substrate;

patterns of a drain electrode, a source electrode, a data line, a conductive layer having at least one slit formed on the gate insulating layer, and the transparent conductive layer in the slit, the transparent conductive layer and the conductive layer being connected to each other to form the pixel electrode;

a passivation layer formed on the source electrode, the drain electrode, the data line and the pixel electrode, the passivation layer having at least one slit, the slit of the passivation layer and the slit in the conductive layer being in a one-to-one correspondence;

the common electrode formed of a transparent conductive layer formed over the passivation layer, the common electrode having a slit structure in a one-to-one correspondence with the slit of the passivation layer.

In one example, the array substrate comprises:

a base substrate;

patterns of a gate electrode, a gate line, a conducive layer having at least one slit formed on the base substrate, and the transparent conductive layer in the slit, the transparent conductive layer and the conductive layer being connected to each other to form the pixel electrode;

a gate insulating layer formed on the gate electrode, the gate line and the pixel electrode, and the gate insulating layer in the pixel region having at least one slit, and the slit of the gate insulating layer and the slit of the conductive layer being in a one-to-one correspondence;

a drain electrode, a source electrode and a data line formed on the gate insulating layer;

a passivation layer formed on the drain electrode, the source electrode and the data line, and the passivation layer corresponding to the pixel region having at least one slit, the slit in the passivation layer and the slit in the gate insulating layer being in a one-to-one correspondence;

the common electrode formed over the passivation layer and formed of a transparent conductive layer, the common electrode having a slit structure in a one-to-one correspondence with the slit in the passivation layer.

In one example, the conductive layer is made of a transparent conductive material.

In one example, the transparent conductive material is ZnMgO.

An embodiment of the invention further provides a display device, comprising the array substrate as mentioned above.

An embodiment of the invention further provides a method of manufacturing an array substrate, comprising:

forming a first conductive layer on a substrate, patterning the first conductive layer to form a conductive layer pattern having at least one slit;

forming an insulating film on the conductive layer pattern, patterning the insulating film to form an insulating layer pattern having an insulating layer slit, the insulating layer slit and the slit in the conductive layer pattern being in a one-to-one correspondence;

forming a second conductive layer on the insulating layer pattern, a portion of the second conductive layer corresponding to the slit falling into the slit and disconnected with a portion of the second conductive layer over the insulating layer pattern, the portion of the second conductive layer falling into the slit being connected with the conductive layer pattern so as to form a first electrode, the portion of the second conductive layer being located over the insulating layer pattern so as to form a second electrode.

In one example, the manufacturing method further comprises steps for fabrication of a thin film transistor, a gate line and a data line, wherein the conductive layer pattern, source and drain electrodes of the thin film transistor, and the data line are formed in a same patterning process.

In one example, the manufacturing method further comprises steps for fabrication of a thin film transistor, a gate line and a data line, the conductive layer pattern and a gate electrode of the thin film transistor are formed in a same patterning process.

According to the method of manufacturing the array substrate provided by the embodiments of the invention, the common electrode and the pixel electrode can be formed by a single process simultaneously, thereby simplifying the manufacturing process of the array substrate, improving production efficiency and reducing production costs.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
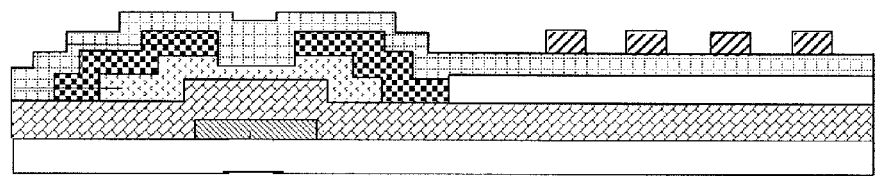
FIG. 1 is a structural diagram for an array substrate of a conventional ADS product.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Embodiments of the invention provide an array substrate, a manufacturing method thereof and a display device, so as to solve the problems of process complexity and high production costs in the existing array substrate manufacturing process.

The manufacturing method of the array substrate in the invention forms a common electrode and a pixel electrode simultaneously by a single process.

A pattern of a conductive layer of the array substrate has at least one slit, and a transparent conductive layer in the slit is connected with the conductive layer of the array substrate so as to form a pixel electrode; therefore, in the manufacturing method of the array substrate in the invention, two transparent conductive layers can be formed only by depositing a transparent conductive layer for one time. Of the two transparent conductive layers, one is to form the common electrode, and the other is located in the slit region and in the same layer as and electrically connected to the conductive layer so as to form the pixel electrode.

Embodiments of the invention also provide an array substrate, the array substrate includes a common electrode and a pixel electrode formed by a single process; wherein the pixel electrode includes a conductive layer having at least one slit, a transparent conductive layer in the slit is connected with the conductive layer so as to from the pixel electrode; the conductive layer is located in the same layer as a gate line or a data line on the array substrate.

In the embodiments of the invention, the common electrode and the pixel electrode can be formed simultaneously by a single process, thereby simplifying manufacturing process of the array substrate, improving production efficiency and reducing production costs.

Hereinafter, with reference to specific embodiments, the array substrate and the manufacturing method thereof according to the invention will be further described.

First Embodiment

A manufacturing method of an array substrate of the embodiment including:

Step 101: sequentially forming a gate metal layer and a gate insulating layer on a base substrate, the gate metal layer including patterns of a gate electrode and a gate line;

Step 102: forming a pattern of an active layer on the substrate formed with the gate insulating layer;

Step 103: forming patterns of a data line, a source electrode and a drain electrode on the substrate formed with the active layer, and forming a pattern of a conductive layer having at least one slit in a pixel region;

Step 104: forming a pattern of a passivation layer on the substrate formed with the data line, the source electrode, the drain electrode and the conductive layer, the passivation layer having a passivation layer slit in a one-to-one correspondence with the slit in the conductive layer;

Step 105: forming a transparent conductive layer on the substrate formed with the passivation layer, the transparent conductive layer including two layers, one of which is formed over the passivation layer to form a common electrode, and the other of which is located in the slit region, in the same layer as and electrically connected to the conductive layer to form a pixel electrode.

Figure 6A:
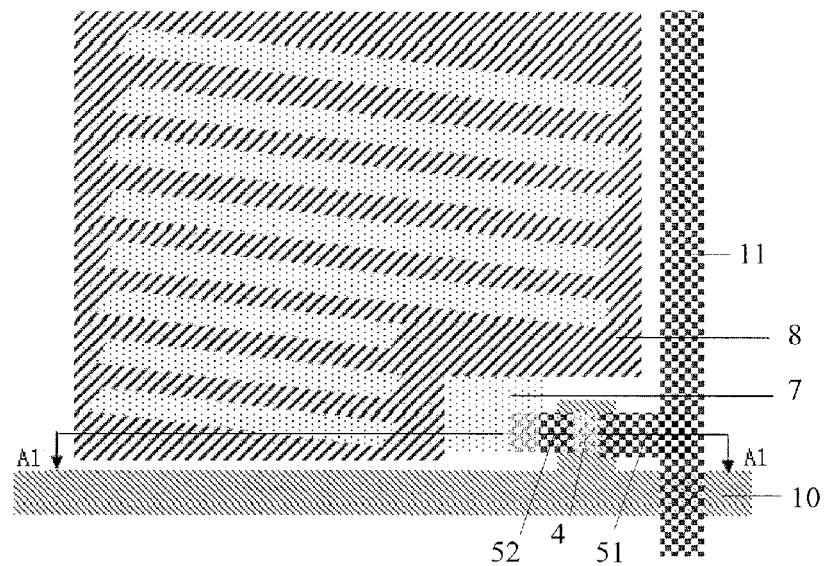
FIG. 6A is a plane view of the array substrate after Step 105 in a first embodiment.
Figure 6B:
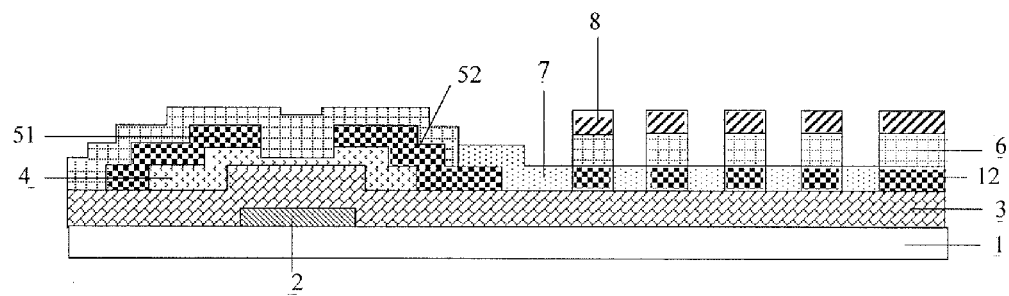
FIG. 6B is a sectional view of the array substrate taken along a direction of A1-A1 in FIG. 6A.

After the above steps, the array substrate of the present embodiment may be formed, as illustrated in FIGS. 6A and 6B, the array substrate in the present embodiment includes:

a base substrate 1;

a gate electrode 2 and a gate line 10 formed on the base substrate 1;

a gate insulating layer 3 formed on the base substrate 1;

patterns of a drain electrode 52, a source electrode 51, a data line 11, a conductive layer 12 having at least one slit formed on the gate insulating layer 3, and a transparent conductive layer 7 in the slit, the transparent conductive layer 7 and the conductive layer 12 being connected with each other to form a pixel electrode;

a passivation layer 6 formed on the source electrode 51, the drain electrode 52, the data line 11 and the pixel electrode, the passivation layer 6 having at least one slit, the slit of the passivation layer 6 and the slit in the conductive layer 12 being in a one-to-one correspondence;

a common electrode formed of a transparent conductive layer 8 formed over the passivation layer 6, the common electrode having a slit structure in a one-to-one correspondence with the slit of the passivation layer 6.

Further, in order to improve the aperture ratio of the array substrate, the conductive layer 12 may be formed of a transparent conductive material, for example, the transparent conductive material can be ZnMgO.

Hereinafter, with reference to specific processes, the manufacturing method of the array substrate according to the embodiment is further described.

Step 101, a gate metal layer and a gate insulating layer are sequentially formed on a base substrate, and the gate metal layer includes patterns of a gate electrode and a gate line.

Figure 2A:
FIG. 2A is a plane view of an array substrate after Step 101 in a first embodiment.
Figure 2B:
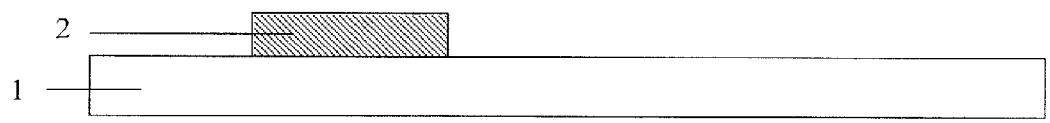
FIG. 2B is a sectional view of the array substrate taken along a direction of A2-A2 in FIG. 2A.

In step 101 of the present embodiment, the gate metal layer is firstly formed through a patterning process on the base substrate 1, the gate metal layer includes a gate electrode 2 and a gate line 10 connected with the gate electrode 2 (as illustrated in FIGS. 2A and 2B). For example, the base substrate 1 may be a glass substrate or a quartz substrate.

For example, a sputtering or thermal evaporation method may be employed to deposit a layer of gate metal on the base substrate 1. The material of the gate metal layer may be Cr, W, Ti, Ta, Mo, Al, Cu and other metals or alloys, and the gate metal layer may also be a multi-layer metal film. A layer of photoresist is applied on the gate metal layer, and the gate electrode 2 and the gate line 10 are formed through a photolithography process (e.g., exposure, developing and etching process using an ordinary mask).

Then, the gate insulating layer 3 is formed on the substrate formed with the gate electrode 2 and the gate line 10.

Figure 3A:
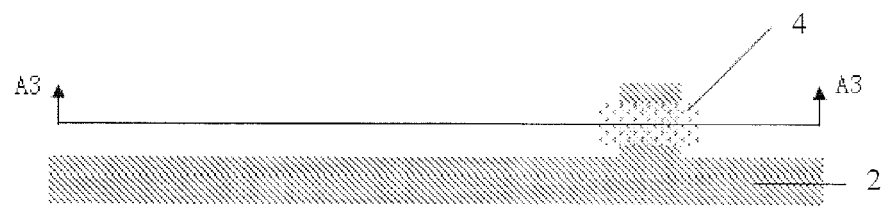
FIG. 3A is a plane view of the array substrate after Step 102 in a first embodiment.
Figure 3B:
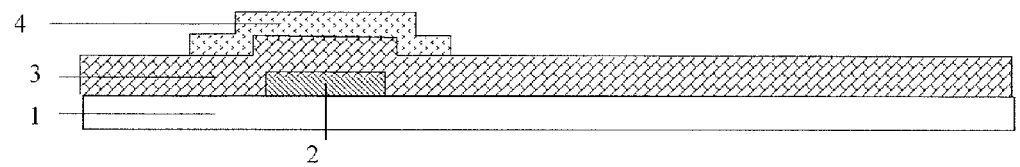
FIG. 3B is a sectional view of the array substrate taken along a direction of A3-A3 in FIG. 3A.

Step 102, a pattern of an active layer 4 is formed on the substrate formed with the gate insulating layer 3 (as illustrated in FIGS. 3A and 3B).

A layer of active layer may be formed on the substrate 1 formed with the gate insulating layer 3, for example, the active layer material may be a composite layer including an a-Si (amorphous silicon) layer and a n+ a-Si layer. A layer of photoresist is applied on the active layer, and the pattern of the active layer 4 is formed through a patterning process (e.g., exposure, developing and etching process using an ordinary mask).

Figure 5A:
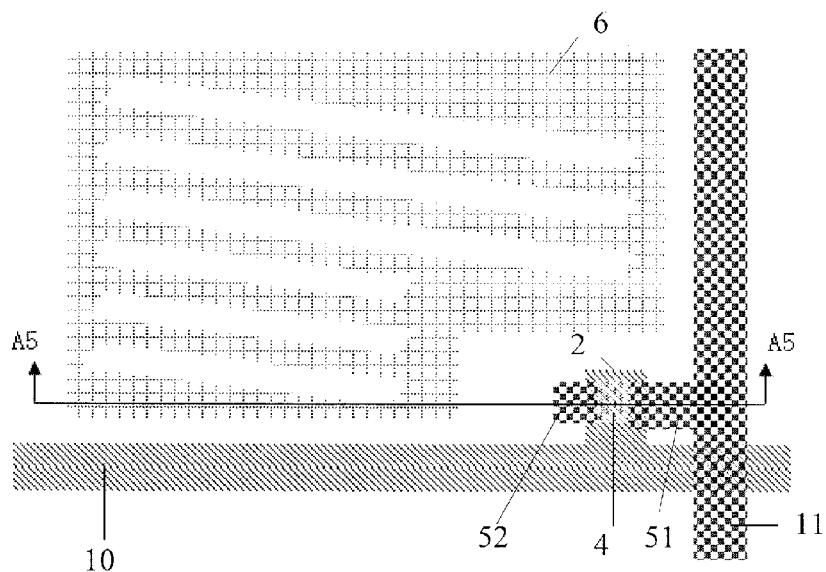
FIG. 5A is a plane view of the array substrate after Step 104 in a first embodiment.
Figure 5B:
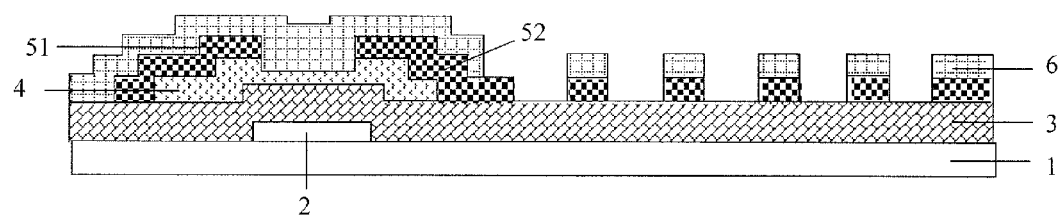
FIG. 5B is a sectional view of the array substrate taken along a direction of A5-A5 in FIG. 5A.

Step 103, patterns of a data line 11, a source electrode 51 and a drain electrode 52 are formed on the substrate formed with the active layer 4, and a pattern of a conductive layer 12 having at least one slit is formed in a pixel region (as illustrated in FIGS. 5A and 5B).

In this step, firstly, a source-drain metal layer is formed on a substrate formed with the active layer; Then, by a patterning process, the data line, the source electrode and the drain electrode with a space therebetween (the part of the active layer corresponding to the space is formed as a channel) above the active layer are formed, and the conductive layer pattern having at least one slit is formed in the pixel region defined by the data line and the gate line crossing with each other.

Figure 4A:
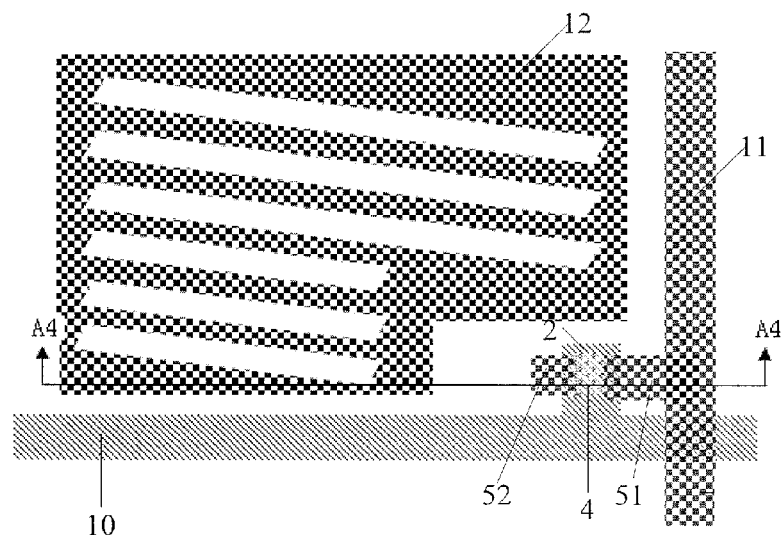
FIG. 4A is a plane view of the array substrate after Step 103 in a first embodiment.
Figure 4B:
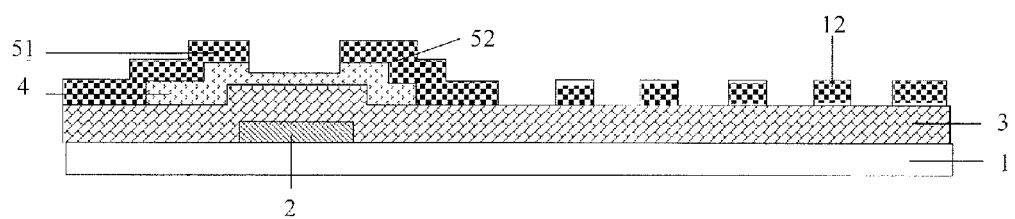
FIG. 4B is a sectional view of the array substrate taken along a direction of A4-A4 in FIG. 4A.

With reference to FIGS. 4A and 4B, a source-drain metal layer is formed on the substrate 1 formed with the active layer 4; through one patterning process, the data line 11 is formed perpendicularly crossing with the gate line 10, the source electrode 51 and the drain electrode 52 spaced from each other (the n+ a-Si needs to be etched at the space between the source electrode 51 and the drain electrode 52) are formed above the active layer 4, and the conductive layer 12 with a plurality of slits is formed in the pixel region defined by the data line 11 and the gate line 10 crossing with each other (as illustrate in FIGS. 4A and 4B).

Further, in order to improve the aperture ratio of the array substrate, the conductive layer 12 may be a transparent conductive material, for example, it may be a transparent conductive oxide ZnMgO, or other transparent conductive materials.

Further, the source-drain metal layer may also employ transparent conductive materials.

Step 104, a pattern of a passivation layer 6 is formed on the substrate 1 formed with the data line 11, the source electrode 51, the drain electrode 52 and the conductive layer 12, the passivation layer 6 has a passivation layer slit in a one-to-one correspondence with the slit in the conductive layer 12.

In this step, firstly, a passivation layer film is formed on the substrate formed with the data line, the source electrode, the drain electrode and the conductive layer; Then, a layer of photoresist is applied on the passivation layer, by a patterning process, the passivation layer slit in the pixel region, which is in a one-to-one correspondence with the slit in the conductive layer, is formed.

For example, with reference to FIGS. 5A, 5B, a passivation layer film is deposited on the substrate by a plasma enhanced chemical vapor deposition (PECVD) method, the passivation layer film can employ oxide, nitride or oxynitride, and the corresponding reaction gas may be $SiH_4$, $NH_3$, $N_2$ mixed gas or $SiH_2Cl_2$, $NH_3$, $N_2$ mixed gas. A layer of photoresist is applied on the passivation layer film, by an ordinary mask patterning process, the pattern of the passivation layer with a plurality of slits is formed in the pixel region defined by the data line 11 and the gate line 10, the plurality of slits in the passivation layer 6 are located in the same positions and in a one-to-one correspondence with the slits in the conductive layer 12.

Step 105, a transparent conductive layer is formed on the substrate 1 formed with the passivation layer 6, the transparent conductive layer comprises two layers, one of which is formed over the passivation layer 6 to form a common electrode, the other layer of which is located in the slit region, in the same layer as and electrically connected to the conductive layer 12 to form a pixel electrode.

In this step, the transparent conductive layer is deposited on the substrate formed with the passivation layer, a portion of the transparent conductive layer remains over the passivation layer to form the first transparent electrode layer, the first transparent electrode layer is a common electrode; another portion of the transparent conductive layer is filled into the slit of the conductive layer, and is electrically connected with the conductive layer to form the second transparent electrode layer, the second transparent electrode layer is connected to the drain electrode to form the pixel electrode.

With reference to FIGS. 6A and 6B, the transparent conductive layer is deposited on the substrate formed with the passivation layer 6 by a sputtering or thermal evaporation method. Due to the height difference and the slope of the passivation layer 6, during the transparent conductive layer is deposited, a part of it is deposited to the slit region so as to form the transparent conductive layer 7 in the slit region connected with the conductive layer 12 as the pixel electrode; a part of it is retained over the passivation layer, and the transparent conductive layer 8 formed over the passivation layer is naturally formed into a common electrode with a slit. That is, the transparent conductive layer is formed into two layers naturally during deposition due to the one-to-one corresponding slits in the passivation layer 6 and the conductive layer 12 in the pixel region, i.e., one layer is formed in the slit region in the same layer as the conductive layer and is electrically connected with the conductive layer 12 so as to form the pixel electrode, and the other layer is formed over the passivation layer so as to from the common electrode. The pixel electrode and the drain electrode 51 are connected with each other (as illustrated in FIGS. 6A and 6B). The transparent conductive layer may employ ITO (Indium Tin Oxide).

The transparent conductive layer 7 and the transparent conductive layer 8 as illustrated in FIGS. 6A and 6B are fabricated by one deposition of transparent conductive layer, but they are located in a higher position and a lower position, respectively. Due to the difference in height and the slope of the passivation layer 6, the first transparent electrode layer and the second transparent electrode layer are naturally disconnected without electrical connection therebetween.

According to the technical solution of the present embodiment, the conductive layer pattern having at least one slit is formed on the gate insulating layer, the passivation layer having at least one slit is formed on the conductive layer, and the slit in the passivation layer and the slit in the conductive layer are in a one-to-one correspondence. When the transparent conductive layer is deposited on the passivation layer, the part of the transparent conductive layer remaining over the passivation layer is formed as the common electrode, the other part of the transparent conductive layer is filled into the slit in the conductive layer and electrically connected with the conductive layer so as to form the pixel electrode connected with the drain electrode. Due to the height difference and the slope of the passivation layer, the common electrode and the pixel electrode are naturally disconnected without electrical connection. The embodiment of the present invention can form the common electrode and the pixel electrode simultaneously by a single process, so that the manufacturing method of the array substrate can be simplified, the production efficiency is improved and the production cost is reduced.

Second Embodiment

The manufacturing method of the array substrate in this embodiment comprises:

Step 801: forming patterns of a gate electrode and a gate line on a base substrate, and forming a pattern of a conductive layer having at least one slit in a pixel region;

Step 802: forming a gate insulating layer on the substrate formed with the gate electrode, the gate line and the conductive layer, and forming a gate insulating layer slit in the pixel region by a patterning process, the gate insulating layer slit and the slit in the conductive layer are in a one-to-one correspondence;

Step 803: forming a pattern of an active layer on the substrate formed with the gate insulating layer;

Step 804: forming patterns of a source electrode, a drain electrode and a data line on the substrate formed with the active layer;

Step 805: forming a pattern of a passivation layer on the substrate formed with the source electrode, the drain electrode and the data line, and forming a passivation layer slit in the pixel region by a patterning process, the passivation layer slit and the gate insulating layer slit being in a one-to-one correspondence;

Step 806: forming a transparent conductive layer on the substrate formed with the passivation layer, the transparent conductive layer including two layers, one of which is formed over the passivation layer to form into a common electrode, and the other of which is located in the slit region, in the same layer as and electrically connected to the conductive layer to form a pixel electrode.

Figure 7:
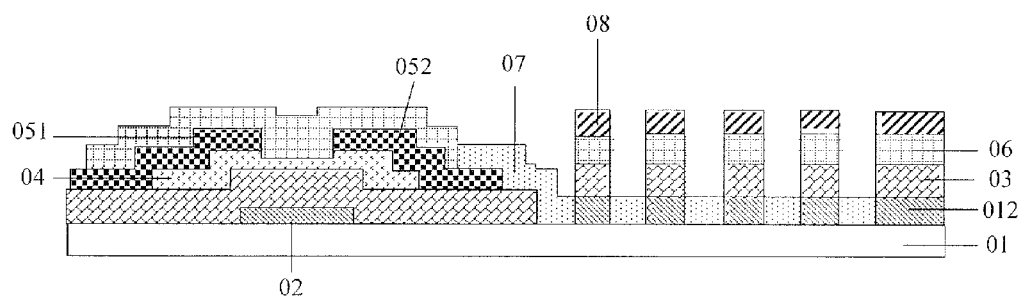
FIG. 7 is a sectional view of an array substrate manufacturing by a manufacturing method according to an embodiment of the invention.

After the above steps, the array substrate of this embodiment can be formed, as illustrated in FIG. 7, the embodiment of the array substrate comprises:

a base substrate 01;

patterns of a gate electrode 02, a gate line, a conducive layer 012 having at least one slit formed on the base substrate 01, and a transparent conductive layer 07 in the slit, the transparent conductive layer 07 and the conductive layer 012 being connected to each other to form a pixel electrode;

a gate insulating layer 03 formed on the gate electrode 02, the gate line and the pixel electrode, and the gate insulating layer 03 in the pixel region having at least one slit, and the slit of the gate insulating layer 03 and the slit of the conductive layer 012 being in a one-to-one correspondence;

a drain electrode 052, a source electrode 051 and a data line formed on the gate insulating layer 03;

a passivation layer 06 formed on the drain electrode 052, the source electrode 051 and the data line, and the passivation layer corresponding to the pixel region having at least one slit 06, the slit in the passivation layer 06 and the slit in the gate insulating layer being in one-to-one correspondence;

a common electrode formed on the passivation layer 06 and formed of a transparent conductive layer 08, the common electrode having a slit structure in a one-to-one correspondence with the slit in the passivation layer.

Further, in order to improve the aperture ratio of the array substrate, the conductive layer 012 may employ a transparent conductive material; for example, the transparent conductive material can be ZnMgO.

Hereinafter, with reference to specific processes, the manufacturing method of the array substrate according to the embodiment is further described.

Step 801: patterns of a gate electrode and a gate line are formed on a base substrate, and a pattern of a conductive layer having at least one slit is formed in a pixel region.

In this step, a gate metal layer is formed on a substrate; through a patterning process, the gate electrode and the gate line are formed, and the conductive layer which is formed of the gate metal layer is formed in the pixel region; the conductive layer has at least one slit.

For example, the gate metal layer is firstly deposited the base substrate; and then by using a patterning process (such as ordinary mask processing), the gate electrode 02 and the gate line connected with the gate electrode 02 are formed on the base substrate 01 by using the gate metal layer, and a pattern of the conductive layer 012 with a plurality of slits is formed in the pixel region by using the gate metal layer.

Preferably, in order to ensure aperture ratio of the array substrate, the gate electrode 02, the gate line and the conductive layer 012 may be made of a transparent conductive material, for example, transparent conductive oxide ZnMgO, or other transparent conductive materials.

Step 802: a gate insulating layer 03 is formed on the substrate 01 formed with the gate electrode 02, the gate line and the conductive layer 012, and a gate insulating layer slit is formed by a patterning process in the pixel region, the gate insulating layer slit and the conductive layer slit are in a one-to-one correspondence.

In this step, a gate insulating layer film is formed on the substrate formed with the gate electrode, the gate line and the conductive layer; a layer of photoresist is applied on the gate insulating layer, through a patterning process, the gate insulating layer with the slit is formed in the pixel region, and the gate insulating layer slit and the conductive layer slit are in a one-to-one correspondence.

For example, the gate insulating layer film is formed on the substrate 01 formed with the gate electrode 02, the gate line and the conductive layer 012, the layer of photoresist is applied on the gate insulating layer film, through the patterning process, the gate insulating layer 03 with slit is formed in the pixel region, and the slit in the gate insulating layer 03 and the slit in the conductive layer 012 are in a one-to-one correspondence.

Step 803: a pattern of an active layer 04 is formed on the substrate 01 formed with the gate insulating layer 03.

For example, an active material layer is deposited on the substrate 01 formed with the gate insulating layer 03, and the active material layer may be a composite layer including an a-Si layer and a n+ a-Si layer. Through a patterning process (such as an ordinary mask), the pattern of the active layer 04 is formed from the active material layer on the gate insulating layer 03.

Step 804: patterns of a source electrode 051, a drain electrode 052 and a data line are formed on the substrate 01 formed with the active layer 04.

For example, a source-drain metal layer is deposited on the substrate 01 formed with the active layer 04, the source-drain metal layer may employ conventional opaque metals such as Mo, AlNd, Al and other metals. Thereafter, by a patterning process (such as an ordinary mask), with the source-drain metal layer, the data line perpendicularly crossing with the gate line, the source electrode 051 and the drain electrode 052 with a space therebetween over the active layer 04 are formed on the substrate 01. (The space between the source electrode 051 and the drain electrode 052 requires an etch on n+ a-Si.)

Step 805: a passivation layer 06 is formed on the substrate 01 formed with the source electrode 051, the drain electrode 052 and the data line, a passivation layer slit is formed by a patterning process in the pixel region, and the passivation layer slit and the gate insulating layer slit are in a one-to-one correspondence.

In this step, a passivation layer film is deposited on the substrate formed with the source electrode, the drain electrode and the data line; a layer of photoresist is applied on the passivation layer film, by a patterning process, the passivation layer with a slit is formed in the pixel region, and the passivation layer slit and the gate insulating layer slit are in a one-to-one correspondence.

For example, the passivation layer film is deposited on the substrate 01 formed with the source electrode 051, the drain electrode 052 and the data line; the layer of photoresist is applied on the passivation layer film, by a patterning process, the passivation layer 06 with a plurality of slits is formed in the pixel region, and the slit of the passivation layer 06 and the slit in the gate insulating layer 03 are in a one-to-one correspondence.

Step 806: a transparent conductive layer is formed on the substrate 01 formed with the passivation layer 06, the transparent conductive layer includes two layers, one of which is formed over the passivation layer 06 to form a common electrode, the other layer of which is formed in the slit region, in the same layer as and electrically connected with the conductive layer 012 to form a pixel electrode.

In this step, the transparent conductive layer is formed on the substrate formed with the passivation layer, a part of the transparent conductive layer remains over the passivation layer to form a first transparent electrode layer which is used as a common electrode; another part of the transparent conductive layer is filled into the slit of the conductive layer which is electrically connected with the conductive layer to form the second transparent electrode layer, the second transparent electrode layer is connected to the drain electrode to form the pixel electrode.

For example, the transparent conductive layer may be deposited on the substrate 01 formed with the passivation layer 06 by a sputtering or thermal evaporation method. The transparent conductive layer may be ITO (Indium Tin Oxide). Due to the height difference and the slope of the passivation layer 06, the transparent conductive layer can be formed naturally into two sections in a high level and a low level, a part 08 of the transparent conductive layer remains over the passivation layer 06 to form the first transparent electrode layer which is used as a common electrode; another part 07 of the transparent conductive layer 07 is filled into the slit of the conductive layer 012 and is electrically connected to the conductive layer to form the second transparent electrode layer, the second transparent electrode layer is connected to the drain electrode to form the pixel electrode. Due to the height difference and the slope of the passivation layer 06, the first transparent electrode layer and the second transparent electrode layer are naturally disconnected without electrical connection therebetween.

Based on the above description, the manufacturing method of the array substrate provided by the present embodiment of the invention comprises: forming a first conductive layer on a substrate, patterning the first conductive layer to form a conductive layer pattern having at least one slit; forming an insulating film on the conductive layer pattern, patterning the insulating film to form an insulating layer pattern having an insulating layer slit, the insulating layer slit and the slit in the conductive layer pattern being in a one-to-one correspondence; forming a second conductive layer on the insulating layer pattern, a part of the second conductive layer corresponding to the slit falling into the slit and disconnected with a part of the second conductive layer over the insulating layer pattern, the part of the second conductive layer falling into the slit being connected with the conductive layer pattern so as to form a first electrode, the part of the second conductive layer being located over the insulating layer pattern so as to form a second electrode.

The manufacturing method may further include steps for the production of a thin film transistor, a gate line and a data line, wherein the conductive layer pattern, source and drain electrodes of the thin film transistor, and the data line are formed in the same patterning process; in this case, the insulating layer pattern and the passivation layer pattern may be formed in the same patterning process.

Alternatively, the conductive layer pattern and the gate electrode of the thin film transistor is formed in the same patterning process; in this case, the insulating layer pattern may comprise two layers (a lower layer and a upper layer), the lower layer and the gate insulating film pattern of the thin film transistor are formed at the same time, the upper layer and the passivation layer pattern are formed in the same patterning process.

One of the above mentioned first electrode and second electrode is the pixel electrode, and the other is the common electrode. For the material selection for each parts mentioned above, the examples in the above embodiments can be referred, which will not be repeated herein.

According to the technical solution of the present embodiment, the conductive layer pattern having at least one slit is formed on the substrate, and the gate insulating layer having at least one slit is formed on the conductive layer, and the slit in the gate insulating layer and the slit in the conductive layer are in a one-to-one correspondence. Thereafter, an active layer, a drain electrode, a source electrode and a data line are formed, and the passivation layer having at least one slit is formed, and the slit in the passivation layer and the slit in the conductive layer are in a one-to-one correspondence. When the transparent conductive layer is deposited on the passivation layer, the part of the transparent conductive layer remaining over the passivation layer is formed as the common electrode, the other part of the transparent conductive layer is filled into the slit in the conductive layer and electrically connected with the conductive layer so as to form the pixel electrode connected with the drain electrode. Due to the height difference and the slope of the passivation layer, the common electrode and the pixel electrode are naturally disconnected without electrical connection. The embodiment of the present invention can form the common electrode and the pixel electrode simultaneously by a single process, so that the manufacturing method of the array substrate can be simplified, the production efficiency is improved and the production cost is reduced.

An embodiment of the present invention provides a display device including the array substrate according to any embodiments as described above. The display device can be: liquid crystal display (LCD) panel, e-paper, OLED panel, LCD TV, LCD monitor, digital photo frame, mobile phone, tablet PC and any other product or component with displaying functions.

The foregoing are merely exemplary embodiments of the invention, but are not used to limit the protection scope of the invention. The protection scope of the invention shall be defined by the attached claims.

What is claimed is:

1. A method of manufacturing an array substrate, wherein, a common electrode and a pixel electrode are formed at the same time through a single process; comprising:
   sequentially forming a gate metal layer and a gate insulating layer on a base substrate, the gate metal layer comprising patterns of a gate electrode and a gate line;
   forming a pattern of an active layer on the substrate formed with the gate insulating layer;
   forming patterns of a data line, a source electrode and a drain electrode on the substrate formed with the active layer, and forming a pattern of a conductive layer having at least one slit in a pixel region;
   forming a pattern of a passivation layer on the substrate formed with the data line, the source electrode, the drain electrode and the conductive layer, the passivation layer having a passivation layer slit in a one-to-one correspondence with the slit in the conductive layer;
   forming a transparent conductive layer on the substrate formed with the passivation layer, the transparent conductive layer comprising two layers, one of which is formed over the passivation layer to form a common electrode, and the other of which is located in the slit region, in the same layer as and electrically connected to the conductive layer to form a pixel electrode.

2. The method of manufacturing the array substrate according to claim 1, wherein, forming patterns of a data line, a source electrode and a drain electrode on the substrate formed with the active layer, and forming a pattern of a conductive layer having at least one slit in a pixel region comprises:
   forming a source-drain metal layer on the substrate formed with the pattern of the active layer;
   by a patterning process, forming the data line, the source electrode and the drain electrode with a space therebetween above the active layer, and forming the conductive layer pattern having at least one slit in the pixel region defined by the data line and the gate line crossing with each other.

3. The method of manufacturing the array substrate according to claim 1, wherein, forming a pattern of a passivation layer on the substrate formed with the data line, the source electrode, the drain electrode and the conductive layer, the passivation layer having a passivation layer slit in a one-to-one correspondence with the slit in the conductive layer comprises:
   forming a passivation layer film on the substrate formed with the data line, the source electrode, the drain electrode and the conductive layer;
   applying a layer of photoresist on the passivation layer, and forming the passivation layer slit in the pixel region which is in a one-to-one correspondence with the slit in the conductive layer by one patterning process.

4. The method of manufacturing the array substrate according to claim 1, wherein, forming a transparent conductive layer on the substrate formed with the passivation layer, the transparent conductive layer comprising two layers, one of which is formed over the passivation layer to form a common electrode, and the other of which is located in the slit region, in the same layer as and electrically connected to the conductive layer to form a pixel electrode comprises:
   forming the transparent conductive layer on the substrate formed with the passivation layer, so that a portion of the transparent conductive layer remains over the passivation layer to form a first transparent electrode layer, and the first transparent electrode layer is the common electrode, and another portion of the transparent conductive layer is filled into the slit of the conductive layer, and is electrically connected with the conductive layer to form a second transparent electrode layer, the second transparent electrode layer is connected to the drain electrode to form the pixel electrode.

5. The method of manufacturing the array substrate according to claim 1, wherein the conductive layer is made of a transparent conductive material.

6. A method of manufacturing the array substrate, wherein, a common electrode and a pixel electrode are formed at the same time through a single process, the method comprising:
   forming patterns of a gate electrode and a gate line on a base substrate, and forming a pattern of a conductive layer having at least one slit in a pixel region;
   forming a gate insulating layer on the substrate formed with the gate electrode, the gate line and the conductive layer, and forming a gate insulating layer slit in the pixel region by a patterning process, the gate insulating layer slit and the slit in the conductive layer being in a one-to-one correspondence;
   forming a pattern of an active layer on the substrate formed with the gate insulating layer;
   forming patterns of a source electrode, a drain electrode and a data line on the substrate formed with the active layer;
   forming a passivation layer on the substrate formed with the source electrode, the drain electrode and the data line, and forming a passivation layer slit in the pixel region by a patterning process, the passivation layer slit and the gate insulating layer slit being in one-to-one correspondence;

forming a transparent conductive layer on the substrate formed with the passivation layer, the transparent conductive layer comprising two layers, one of which is formed over the passivation layer to form a common electrode, and the other of which is located in the slit region, in the same layer as and electrically connected to the conductive layer to form a pixel electrode.

7. The method of manufacturing the array substrate according to claim 6, wherein, forming patterns of a gate electrode and a gate line on a base substrate, and forming a pattern of a conductive layer having at least one slit in a pixel region comprises:

forming a gate metal layer on the base substrate;

through one patterning process, forming the gate electrode and the gate line, and forming the pattern of the conductive layer which is formed of the gate metal layer in the pixel region, the conductive layer having at least one slit.

8. The method of manufacturing the array substrate according to claim 6, wherein, forming a gate insulating layer on the substrate formed with the gate electrode, the gate line and the conductive layer, and forming a gate insulating layer slit in the pixel region by a patterning process, the gate insulating layer slit and the slit in the conductive layer being in a one-to-one correspondence comprises:

forming a gate insulating layer film on the substrate formed with the gate electrode, the gate line and the conductive layer;

applying a layer of photoresist on the gate insulating layer, through a patterning process, forming the gate insulating layer with the slit in the pixel region, and the gate insulating layer slit and the conductive layer slit being in a one-to-one correspondence.

9. The method of manufacturing the array substrate according to claim 6, wherein, forming a passivation layer on the substrate formed with the source electrode, the drain electrode and the data line, and forming a passivation layer slit in the pixel region by a patterning process, the passivation layer slit and the gate insulating layer slit being in a one-to-one correspondence comprises:

forming a passivation layer film on the substrate formed with the source electrode, the drain electrode and the data line;

applying a layer of photoresist on the passivation layer film, through a patterning process, forming the passivation layer with the slit in the pixel region, and the passivation layer slit and the gate insulating layer slit being in a one-to-one correspondence.

10. The method of manufacturing the array substrate according to claim 6, wherein, forming a transparent conductive layer on the substrate formed with the passivation layer, the transparent conductive layer comprising two layers, one of which is formed over the passivation layer to form a common electrode, and the other of which is located in the slit region, in the same layer as and electrically connected to the conductive layer to form a pixel electrode comprises:

forming the transparent conductive layer on the substrate formed with the passivation layer, so that a portion of the transparent conductive layer remains over the passivation layer to form a first transparent electrode layer, the first transparent electrode layer is a common electrode, and another portion of the transparent conductive layer is filled into the slit of the conductive layer and is electrically connected with the conductive layer to form a second transparent electrode layer, the second transparent electrode layer being connected to the drain electrode to form the pixel electrode.

11. An array substrate comprising:
a base substrate;
a common electrode;
a pixel electrode fabricated by a single process, wherein the pixel electrode comprises a conductive layer having at least one slit, a transparent conductive layer in the slit and the conductive layer are connected to each other to form the pixel electrode, and the conductive later is in the same layer as a gate line or a data line on the array substrate;
a gate electrode and a gate line formed on the base substrate;
a gate insulating layer formed on the base substrate;
patterns of a drain electrode, a source electrode, a data line, a conductive layer having at least one slit formed on the gate insulating layer, and the transparent conductive layer in the slit, the transparent conductive layer and the conductive layer being connected to each other to form the pixel electrode; and
a passivation layer formed on the source electrode, the drain electrode, the data line and the pixel electrode, the passivation layer having at least one slit, the slit of the passivation layer and the slit in the conductive layer being in a one-to-one correspondence;
wherein the common electrode formed of a transparent conductive layer is formed over the passivation layer, and the common electrode has a slit structure in a one-to-one correspondence with the slit of the passivation layer.

12. The array substrate according to claim 11, wherein the conductive layer is made of a transparent conductive material.

13. array substrate according to claim 12, wherein the transparent conductive material is ZnMgO.

14. An array substrate comprising:
a base substrate;
a common electrode;
a pixel electrode fabricated by a single process, wherein the pixel electrode comprises a conductive layer having at least one slit, a transparent conductive layer in the slit and the conductive layer are connected to each other to form the pixel electrode, and the conductive layer is in the same later as a gate line or a data line on the array substrate;
patterns of a gate electrode, a gate line, a conducive layer having at least one slit formed on the base substrate, and the transparent conductive layer in the slit, the transparent conductive layer and the conductive layer being connected to each other to form the pixel electrode;
a gate insulating layer formed on the gate electrode, the gate line and the pixel electrode, and the gate insulating layer in the pixel region having at least one slit, and the slit of the gate insulating layer and the slit of the conductive layer being in a one-to-one correspondence;
a drain electrode, a source electrode and a data line formed on the gate insulating layer; and
a passivation layer formed on the drain electrode, the source electrode and the data line, and the passivation layer corresponding to the pixel region having at least one slit, the slit in the passivation layer and the slit in the gate insulating layer being in a one-to-one correspondence;
wherein the common electrode is formed over the passivation layer and formed of a transparent conductive layer, and the common electrode has a slit structure in a one-to-one correspondence with the slit in the passivation layer.

15. A method of manufacturing an array substrate, comprising:

forming a first conductive layer on a substrate, patterning the first conductive layer to form a conductive layer pattern having at least one slit;

forming an insulating film on the conductive layer pattern, patterning the insulating film to form an insulating layer pattern having an insulating layer sat, the insulating layer slit and the slit in the conductive layer pattern being in a one-to-one correspondence; and forming a second conductive layer on the insulating layer pattern, a portion of the second conductive layer corresponding to the slit falling into the slit and disconnected with a portion of the second conductive layer over the insulating layer pattern, the portion of the second conductive layer falling into the slit being connected with the conductive layer pattern so as to form a first electrode, the portion of the second conductive layer being located over the insulating layer pattern so as to form a second electrode.

16. The method according to claim 15, further comprising steps for fabrication of a thin film transistor, a gate line and a data line, wherein the conductive layer pattern, source and drain electrodes of the thin film transistor, and the data line are formed in a same patterning process.

17. The method according to claim 15, further comprising steps for fabrication of a thin film transistor, a gate line and a data line, the conductive layer pattern and a gate electrode of the thin film transistor are formed in a same patterning process.

* * * * *